(12) United States Patent
Lower et al.

(10) Patent No.: US 9,177,907 B1
(45) Date of Patent: Nov. 3, 2015

(54) HIGH PERFORMANCE DEPOSITED DIE ATTACH

(75) Inventors: Nathan P. Lower, North Liberty, IA (US); Ross K. Wilcoxon, Cedar Rapids, IA (US); Nathaniel P. Wyckoff, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 64 days.

(21) Appl. No.: 13/438,433

(22) Filed: Apr. 3, 2012

(51) Int. Cl.
*H01L 21/50* (2006.01)
*H01L 23/522* (2006.01)

(52) U.S. Cl.
CPC .............. *H01L 23/522* (2013.01); *H01L 21/50* (2013.01)

(58) Field of Classification Search
CPC ..... H01L 23/522; H01L 23/34; H01L 21/768; H01L 21/50; H01L 31/18; H01L 31/0203; H01L 21/48
USPC ......... 438/112, 123, 124, 611, 612, 622, 120, 438/125; 257/E23.02, E23.034, E23.035, 257/E23.037, E23.054, E23.061, E23.039, 257/432, 65, E31.117, 698, 713, E23.142, 257/E23.08, E21.499, E21.575
See application file for complete search history.

(56) References Cited

U.S. PATENT DOCUMENTS

| | | | |
|---|---|---|---|
| 5,173,766 A * | 12/1992 | Long et al. ................. | 257/687 |
| 5,225,023 A * | 7/1993 | Wojnarowski et al. ....... | 156/298 |
| 5,904,504 A | 5/1999 | Allen | |
| 7,270,867 B1 * | 9/2007 | Kwan et al. .................. | 428/111 |
| 2004/0124543 A1 | 7/2004 | Condie et al. | |
| 2004/0212054 A1 | 10/2004 | Maxwell et al. | |
| 2006/0194373 A1 * | 8/2006 | Fee et al. ...................... | 438/125 |
| 2008/0197435 A1 * | 8/2008 | Yang et al. .................... | 257/432 |
| 2010/0213603 A1 * | 8/2010 | Smeys et al. .................. | 257/698 |
| 2010/0327429 A1 * | 12/2010 | Ou ................................ | 257/698 |

* cited by examiner

*Primary Examiner* — David Vu
*Assistant Examiner* — Mouloucoulaye Inoussa
(74) *Attorney, Agent, or Firm* — Angel N. Gerdzhikov; Donna P. Suchy; Daniel M. Barbieri

(57) ABSTRACT

A method of manufacturing an integrated circuit device includes providing a substrate; forming at least one cavity in the substrate; positioning a die within the at least one cavity of the substrate; and depositing a die attach material around the die within the at least one cavity to mechanically bond the die to the substrate.

17 Claims, 4 Drawing Sheets

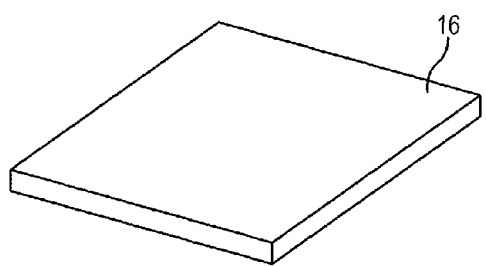
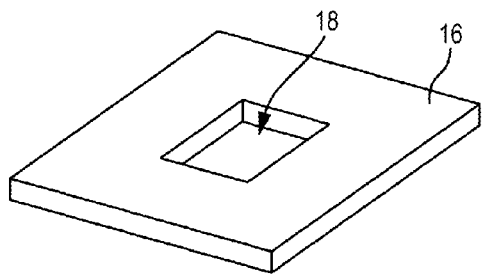
FIG. 4　　　　　　　　　FIG. 5
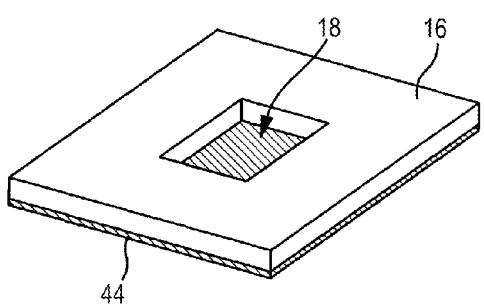
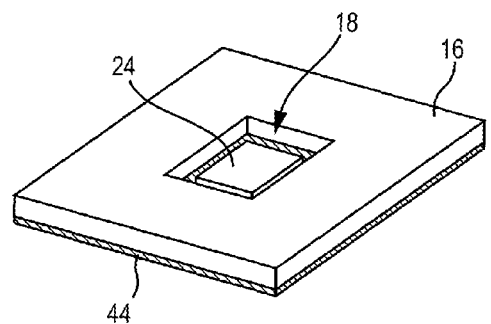
FIG. 6　　　　　　　　　FIG. 7
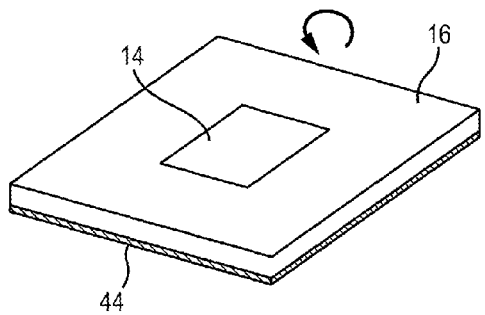
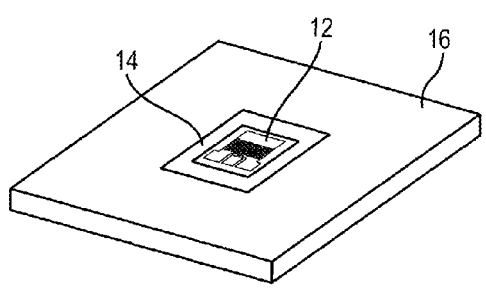
FIG. 8　　　　　　　　　FIG. 9

HIGH PERFORMANCE DEPOSITED DIE ATTACH

BACKGROUND

The present disclosure relates generally to the field of electronic components such as semiconductor devices, and more specifically, to methods of making high performance, high reliability semiconductor devices having reduced thermal resistance and reduced thermal stresses.

There are many challenges associated with electronics components and manufacturing reliable electronic components such as transistors, light emitting diodes (LEDs), etc. Accordingly, various embodiments of the present disclosure are directed to improved systems and methods of manufacturing electronics components.

SUMMARY

One embodiment relates to a method of manufacturing an integrated circuit device comprising providing a substrate; forming at least one cavity in the substrate; positioning a die within the at least one cavity of the substrate; and depositing a die attach material around the die within the at least one cavity to mechanically bond the die to the substrate.

Another embodiment relates to a method of attaching a die to a substrate, the method comprising forming a plurality of cavities in a substrate, each of the plurality of cavities extending from a first surface of the substrate to a second surface of the substrate opposite the first surface; positioning a die within each of the plurality of cavities; and depositing a die attach material around each of the dies and in each of the plurality of cavities to form a mechanical bond between the die and the substrate.

Another embodiment relates to an integrated circuit device comprising a substrate having a first surface and a second surface opposite the first surface; a die having an active surface; and a die attach material mechanically bonding the substrate to the die such that the active surface of the die is substantially flush with the first surface of the substrate.

BRIEF DESCRIPTION OF THE DRAWINGS

FIG. 4 is a perspective view of a substrate prior to processing according to an exemplary embodiment.

FIG. 5 is a perspective view of a substrate having a cavity formed therein according to an exemplary embodiment.

FIG. 6 is a perspective view of the a substrate and cavity with a film attached to a side of the substrate according to an exemplary embodiment.

FIG. 7 is a perspective view of a die positioned within a cavity of a substrate according to an exemplary embodiment.

FIG. 8 is a perspective view of a substrate having a die attach material deposited around a die positioned within a cavity in the substrate according to an exemplary embodiment.

FIG. 9 is a perspective view of a die coupled to a substrate with a die attach material according to an exemplary embodiment.

DETAILED DESCRIPTION OF EXEMPLARY EMBODIMENTS

Electronics components such as semiconductor devices, integrated circuit devices or components, etc. may include a die (e.g., a transistor, power amplifier, light emitting diode (LED), etc.) that is attached to a substrate (e.g., a silicon wafer) by way of a die attach material (e.g., an adhesive, a metal, etc.). Many die attach materials such as solders and silver epoxy materials have thermal conductivities (e.g., 60 W/mK) that may be 1-2 orders of magnitude lower than that of thermally conductive metals such as, for example, copper, aluminum, and gold. The thermal resistance of the die attach material plays a significant role in the maximum power capabilities of the device being attached (e.g., to a substrate), especially at the high heat flux densities of, for example, typical power transistors. To reduce thermal resistance, a metallic die attach may be used, but the processing temperatures of such metallic die attaches typically preclude the use of such materials with many devices due to the residual stresses and/or costs associated with the high temperatures.

Furthermore, thermal expansion of the die, die attach, and substrate may generate unwanted stresses within the device. For example, if the coefficients of thermal expansion (CTEs) differ significantly between the die, die attach, and/or substrate, stresses may be generated during use of the device as a result of temperature changes (e.g., temperature cycling) in the device. These effects can be significantly exacerbated by any high temperature (e.g., non-ambient) assembly processes utilized during the die attach process that result in residual stresses generated within the device.

Accordingly, various embodiments disclosed herein may provide for die attaches and methods of attaching dies that establish low thermal resistance paths (e.g., up to 10 times lower thermal resistance) between an integrated circuit die and a substrate (e.g., a silicon wafer, a thermal spreader, etc.) and minimize thermal stresses generated by mismatched CTEs and/or non-ambient processing temperatures.

Figure 1:
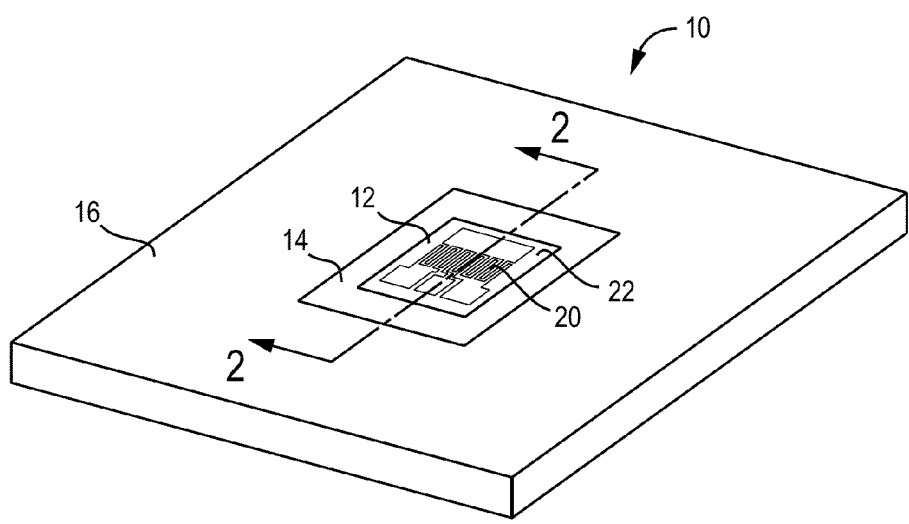
FIG. 1 is a perspective view of an electronic component according to an exemplary embodiment.

Referring now to FIG. 1, an electronics component is shown as component 10 according to an exemplary embodiment. Component 10 may be any of a variety of devices, including semiconductor devices such as high power transistor assemblies, a processing chip or controller, a packaged die, integrated circuit, etc. Component 10 may further take other forms, and all such components are understood as being included in the present disclosure.

As shown in FIG. 1, component 10 may include a die 12, a die attach 14, and a substrate 16. Die 12 is typically an electronics sub-component (e.g., a transistor, diode, etc.) that may include electrical circuitry embedded in, for example, a semiconductor material. Die 12 may be a high power die such as a Gallium Nitride (GaN) or LED die. Die attach material 14 is a material (e.g., a thermally and electrically conductive material) used to attach (e.g., bond, adhere, couple, etc.) die 12 to substrate 16. Substrate 16 may be or include a semiconductor and/or metallic material (e.g., silicon, ceramic, aluminum nitride (AlN), nickel-cobalt ferrous alloys, copper, etc.), and provide support for one or more dies such as die 12 for integration into a larger circuitry component.

Referring further to FIG. 1, according to an exemplary embodiment, substrate 16 may be a generally planar member (e.g., a silicon wafer or a portion thereof) having one or more cavities 18 (e.g., holes, apertures, etc.) extending there-through. In some embodiments, substrate 16 may be approximately 10 mils (thousandths of an inch) thick, 20 mils thick, or another suitable thickness. One or more die 12 may be positioned within each cavity 18 (as shown, e.g., in FIGS. 5-7). Cavity 18 may be oversized relative to die 12 such that there is a peripheral space, or gap, between the sides of die 12 and substrate 16, and further such that the thickness of substrate 16 exceeds the thickness of die 12. In one embodiment, die attach material 14 is provided within cavity 18 and around die 12, such that die 12, die attach material 14, and substrate 16 form at least one generally planar surface.

Figure 2:
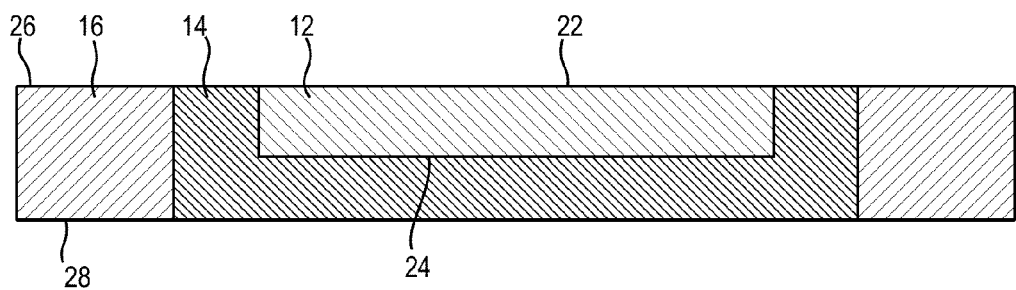
FIG. 2 is a cross section view of the electronic component of FIG. 1 taken along line 2-2 according to an exemplary embodiment.
Figure 3:
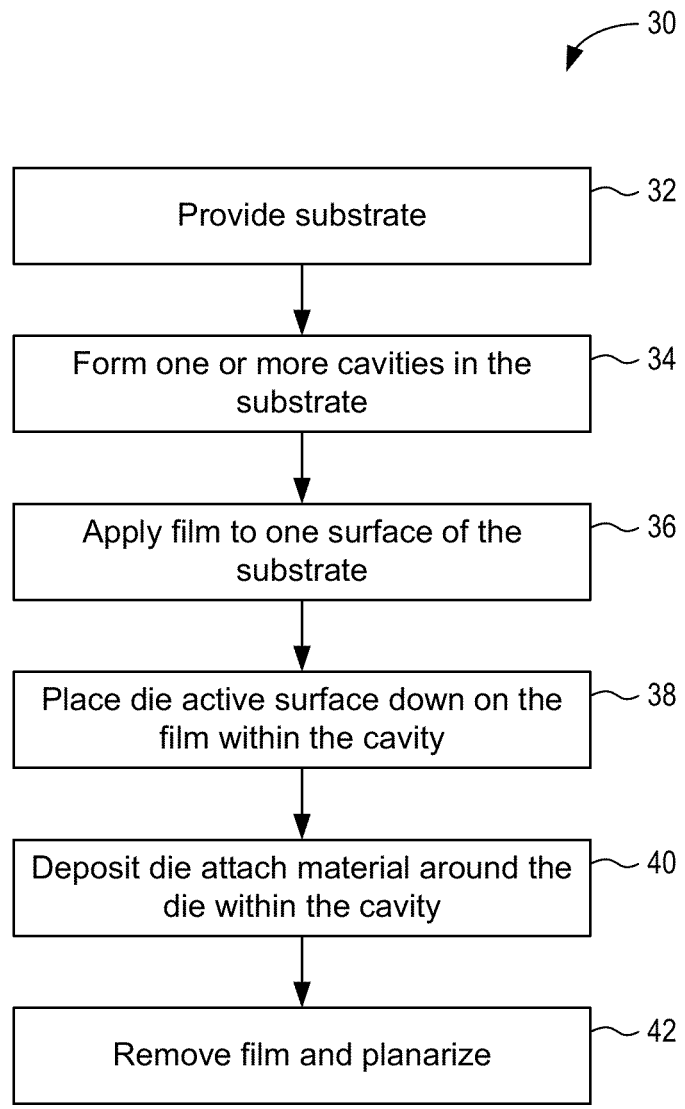
FIG. 3 is a flow chart illustrating a process of manufacturing an electronic component according to an exemplary embodiment.

For example, referring to FIGS. 1 and 2, die 12 may include circuit elements 20 that are accessible by way of an active surface 22 of die 12. A non-active surface 24 may be generally opposite active surface 22 (see, e.g., FIG. 2). Substrate 16 may include a first, or top surface 26, and a second, or bottom surface 28 generally opposite top surface 26. In some embodiments, top surface 26 of substrate 16, die attach material 14, and die 12 (e.g., active surface 22) form a generally planar (e.g., flush, flat, etc.) surface. In further embodiments, second surface 28 and die attach material 14 may also form a generally planar surface. As such, component 10 may include one or two generally planar surfaces defined by substrate 16, die attach material 14, and/or die 12.

According to an exemplary embodiment, die attach material 14 mechanically and thermally couples die 12 to substrate 16. Die attach material 14 may also electrically couple die 12 to substrate 16. As shown in FIGS. 1-2, die attach material 14 provides a three-dimensional (3D) interconnect for die 12. For example, die 12 may include a number of sides extending between surfaces 22 and 24, and die attach material 14 may be in substantially total contact with surface 24 and the sides of die 12, leaving only active surface 22 exposed in order to facilitate electrical interconnections between die 12 and other electronics components. According to one embodiment, die attach 14 is a solid copper material, while in other embodiments, other suitable materials may be utilized (e.g., nickel, etc.).

Figure 10:
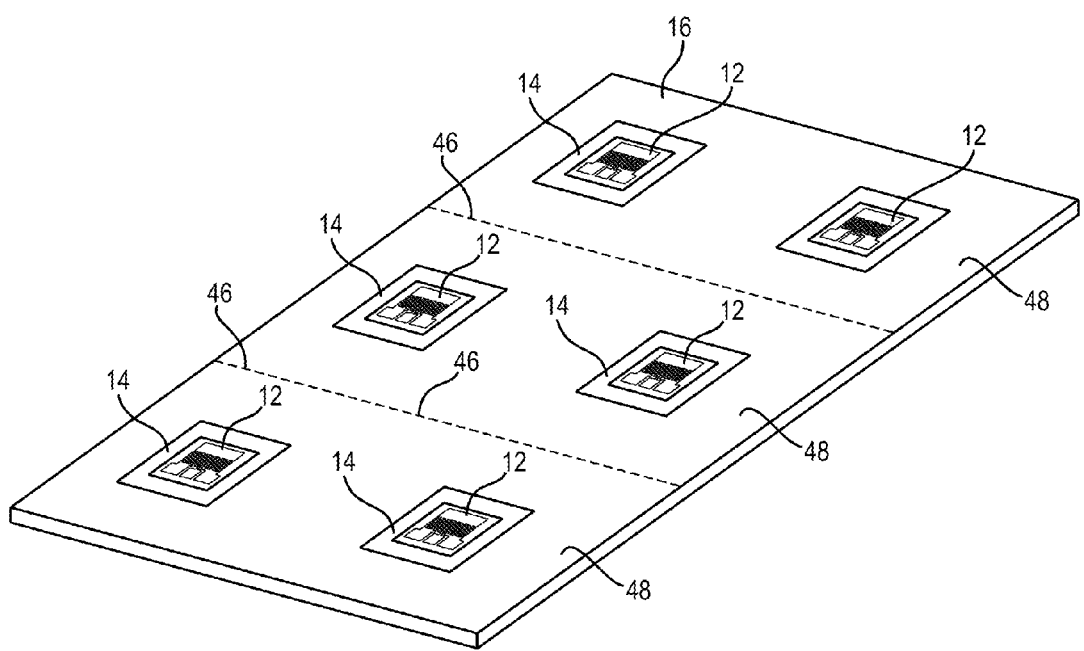
FIG. 10 is a perspective view of a substrate having a plurality of dies embedded therein according to an exemplary embodiment.

In some embodiments, die 12 is a generally rectangular component, and cavity 18 in substrate 16 is a correspondingly rectangular-shaped cavity extending through substrate 16. According to other embodiments, die 12 and/or cavity 18 may take other shapes. Furthermore, more than one die 12 may be embedded within substrate 16 (as discussed in greater detail below), and substrate 16 may be diced (e.g., sawed, cut, etc.) into a number of portions, each portion including one or more dies 12 therein. For example, as shown in FIG. 10, substrate 16 includes a number of dies 12. After embedding dies 12 within substrate 16 using die attach material 14, substrate 16 may be diced along lines 46 into portions 48, each of which may include one or more dies of the same or different type.

Referring now to FIGS. 3-9, a method 30 of manufacturing an integrated circuit device or component such as component 10 is illustrated according to an exemplary embodiment. First, as shown in FIG. 4, a substrate such as substrate 16 is provided (step 32). The substrate may be a silicon wafer, a metallic substrate, a ceramic substrate, or any other suitable substrate. As discussed above, the substrate may be a generally planar member, and may take any suitable peripheral shape.

Next, one or more cavities such as cavity 18 are formed in the substrate (step 34). As shown in FIG. 5, the cavities generally extend fully through the substrate, and are sized such that a gap, or space is provided between the perimeter of the die and the substrate upon placement of the die within the cavity. The cavities may be formed using any suitable process, including machining, laser-drilling, wet-etching, etc. Other processes may be used according to various other embodiments, and all such process are understood to be included in the scope of the present disclosure.

After the cavities are formed, a film such as a film 44 shown in FIG. 6 is applied to a surface of the substrate (step 36). As shown in FIG. 6, the film is applied such that the film covers the cavity formed in the substrate. According to an exemplary embodiment, the film is an adhesive film that is ultra-violet (UV) releasable, such that the film is configured to release from the substrate, die, and/or die attach material upon exposure to UV light. According to various other embodiments, other suitable films may be utilized. In some alternative embodiments, film 44 may be or include a rigid member (e.g., a UV-releasable rigid member, a mechanically attachable/releasable rigid member, etc.). Utilizing a rigid member as the film or backing may allow the die to be recessed or raised relative to the substrate surface (e.g., by using a rigid member with a correspondingly recessed or raised portion upon which the die is placed). Using a rigid member may also provide for tighter control of the coplanarity of the die/substrate.

As shown in FIG. 7, after application of the film to the substrate, a die such as die 12 is positioned within each cavity (step 38). While only a single cavity is shown in FIG. 7, it should be understood that the methods illustrated herein may be applied simultaneously to multiple cavities in a single substrate (see. E.g., FIG. 10). The particular type of die may be the same or differ from cavity to cavity within a particular substrate. In some embodiments, the dies may be placed within the cavities with a suitable "pick and place" automated device that properly positions, or registers, the appropriate die within each cavity. In other embodiments, the dies may be manually placed within the cavities. The adhesive layer of the film is exposed in the area of the cavity such that when the die is placed within the cavity the die adheres to the film and remains in a desired position. According to an exemplary embodiment, the die is placed with the active surface down (e.g., facing the film) such that once the process is completed, the active surface of the die and the circuit elements (see circuit elements 20 shown in FIG. 1) are accessible for further processing, interconnections, etc. Furthermore, in some embodiments the active surface of the die is positioned such that it is substantially flush with the surface of the substrate.

After the die is properly registered within the cavity, a die attach material such as die attach material 14 is deposited around the die and within the cavity (step 40). As part of depositing the die attach material, a seed layer of a conductive and/or metallic (e.g., Titanium tungsten (TiW), gold (Au), copper, etc.) material may optionally first be applied to the die, substrate, and film (e.g., those portions of the die, substrate, and film forming and within the cavity) to provide a conductive layer of material and ensure optimal adhesion strength and electrical continuity between components. The seed layer may utilize any suitable material, and any suitable process may be used, such as sputtering, etc. After application of the seed layer, a die attach material may then be deposited around the die and within the cavity using, for example, an electroplating or electrodeposition process to fill any space within the cavity not otherwise occupied by the die (see, e.g., FIG. 8).

According to an exemplary embodiment, the electroplating process is performed at ambient temperature (e.g., at near-room temperature such as, e.g., 20-50 degrees Celsius) such that minimal residual stresses are generated as a result of the use of elevated processing temperatures. The substrate, film, and die may be placed, for example, into an electroplating solution or bath. A suitable chemistry for the electroplating solution or bath may be utilized that provides for sufficient "throwing" of the metal into high aspect ratio areas (e.g., the gap between the sides of the die and the substrate). Once the electroplating process is complete, a solid die attach material such as copper is bonded to both the die and the substrate.

Once the die attach material is deposited, the film may be removed and one or both sides of the substrate (including the die and/or die attach material) may be planarized (e.g., flattened, polished, etc.) (step 42). In one embodiment, the film is a UV releasable film such that upon exposure to UV light, the film releases from the substrate, die, and die attach material. The film may have other release properties according to various other embodiments. One or both sides of the substrate may be planarized to provide a substantially flush surface to one or both sides of the completed electronics component. In some embodiments, the film is retained during planarization of the opposite side (e.g., to protect the active surface of the die), and the film is subsequently removed after planarization.

After planarization and/or removal of the film, the die can be further processed using any appropriate and suitable processing methods, including soldering, wire-bonding, or a variety of other technologies to electrically interconnect die 12 to substrate 16 and/or other die in the assembly. Furthermore, the substrate may be singulated (e.g., separated, divided, etc.) into individual assemblies of die or groups of dies.

The electronics component and associated methods described herein may provide many advantages over more conventional components and methods. For example, the die is bonded to the die attach material in a three-dimensional fashion (e.g., via the bottom and four sides), providing a 3D thermal conductivity pathway that is not available utilizing standard die attach methods. Furthermore, the embodiments enable making high performance, highly miniaturized/integrated RF systems, where different types of dies may be embedded adjacent each other with short interconnections, providing integrated heterogeneous systems that may be batch fabricated (e.g., with numerous dies embedded within a single substrate during a single process) to reduce costs. Further yet, because the die attach material is deposited at substantially room temperature, no residual stresses are generated as a result of, for example, elevated processing temperatures that may otherwise be utilized. In addition, the die attach fill material, such as electroplated copper, may be more suitable than the bare die for attachment methods such as soldering when assembling the device to the next level assembly, such as a printed circuit board.

For purposes of this disclosure, the term "coupled" shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. Such joining may also relate to mechanical, fluid, or electrical relationship between the two components.

It is important to note that the construction and arrangement of the elements of the electronics component as shown in the exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, materials, colors, orientations, etc.) without materially departing from the novel teachings and advantages of the subject matter recited in the embodiments. Accordingly, all such modifications are intended to be included within the scope of the present disclosure as defined in the appended claims. The order or sequence of any process or method steps may be varied or re-sequenced according to alternative embodiments. Other substitutions, modifications, changes, and/or omissions may be made in the design, operating conditions, and arrangement of the exemplary embodiments without departing from the spirit of the present disclosure.

What is claimed is:

1. A method of manufacturing an integrated circuit device comprising:
    providing a substrate having a first surface and a second surface opposite the first surface;
    forming at least one cavity in the substrate, the cavity extending through the substrate from the first surface to the second surface;
    applying a removable film to the first surface of the substrate;
    positioning at least one die within the at least one cavity of the substrate such that an active surface of the die physically contacts and faces the removable film;
    depositing a die attach material around the at least one die within the at least one cavity to mechanically bond the at least one die to the substrate; and
    planarizing the die attach material and the second surface of the substrate opposite the first surface and opposite the removable film after depositing the die attach material around the at least one die such that the second surface of the substrate and the die attach material form a substantially planar surface.

2. The method of claim 1, further comprising
    removing the film from the first surface of the substrate after depositing the die attach material around the die within the cavity.

3. The method of claim 2, further comprising depositing a seed layer of conductive material to the substrate, the film, and the die prior to depositing the die attach material.

4. The method of claim 1, wherein depositing the die attach material comprises electroplating an electrically conductive material around at least a portion of the die.

5. The method of claim 1, wherein the die attach material comprises copper.

6. The method of claim 1, wherein the substrate comprises a silicon wafer.

7. The method of claim 1, wherein the at least one cavity comprises a plurality of cavities provided in the substrate, and wherein a die is placed in each of the plurality of cavities.

8. The method of claim 1, wherein the die attach material is deposited at ambient temperature of approximately 20-50 degrees Celsius.

9. A method of attaching a die to a substrate, the method comprising:
    forming a plurality of cavities in a substrate, each of the plurality of cavities extending from a first surface of the substrate to a second surface of the substrate opposite the first surface;
    applying a removable film to the first surface of the substrate;
    positioning one or more die within each of the plurality of cavities such that each die adheres to the removable film and an active surface of each die physically contacts and faces the removable film; and depositing a die attach material around each of the dies and in each of the plurality of cavities to form a mechanical bond between the die and the substrate;

planarizing the die attach material and the second surface of the substrate after depositing the die attach material around each of the dies such that the second surface of the substrate and the die attach material form a substantially planar surface.

10. The method of claim 9, wherein positioning a die within each of the plurality of cavities comprises adhering the die to the removable film.

11. The method of claim 9, further comprising depositing a seed layer of a conductive material onto at least a portion of each die, each cavity, and the substrate.

12. The method of claim 9, wherein each die and the substrate comprise semiconductor materials and the die attach comprises copper.

13. The method of claim 9, wherein each die comprises a top, a bottom, and a plurality of sides extending between the top and the bottom, and wherein the die attach material contacts substantially all of the bottom and the plurality of sides of each die.

14. The method of claim 2, wherein the active surface of the die is exposed after removing the film.

15. The method of claim 9, further comprising removing the removable film from the first surface of the substrate to expose the active surface of each die.

16. The method of claim 1, wherein the die attach material is in substantially total contact with the exterior of the die except for the active surface and thermally and electrically couples the die to the substrate.

17. The method of claim 16, wherein the die occupies a first portion of the cavity and the die attach material occupies a remaining portion of the cavity such that the first side of the substrate, the active surface of the die, and the die attach material form a first generally planar surface, and the second side of the substrate and the die attach material form a second generally planar surface opposite the first generally planar surface.

* * * * *